United States Patent [19]
Gardner et al.

[11] Patent Number: 5,936,287
[45] Date of Patent: Aug. 10, 1999

[54] NITROGENATED GATE STRUCTURE FOR IMPROVED TRANSISTOR PERFORMANCE AND METHOD FOR MAKING SAME

[75] Inventors: Mark I. Gardner; H. Jim Fulford, Jr., both of Austin, Tex.

[73] Assignee: Advanced Micro Devices, Inc.

[21] Appl. No.: 09/189,279

[22] Filed: Nov. 10, 1998

Related U.S. Application Data

[62] Division of application No. 08/666,017, Jun. 19, 1996, Pat. No. 5,872,049.

[51] Int. Cl.$^6$ ............................ H01L 29/76; H01L 29/94; H01L 29/167; H01L 29/107
[52] U.S. Cl. ......................... 257/369; 257/371; 257/607; 257/914
[58] Field of Search ................................... 257/369, 371, 257/607, 914

[56] References Cited

U.S. PATENT DOCUMENTS

| | | |
|---|---|---|
| 4,774,197 | 9/1988 | Haddad et al. . |
| 4,897,368 | 1/1990 | Kobushi et al. . |
| 4,914,046 | 4/1990 | Tobin et al. . |
| 5,250,456 | 10/1993 | Bryant . |
| 5,266,816 | 11/1993 | Seto et al. .................................. 257/65 |
| 5,429,972 | 7/1995 | Anjun et al. . |
| 5,470,764 | 11/1995 | Ikegami et al. . |
| 5,516,707 | 5/1996 | Loh et al. . |
| 5,567,638 | 10/1996 | Lin et al. . |
| 5,581,092 | 12/1996 | Takemura .................................. 257/65 |
| 5,605,848 | 2/1997 | Ngaoaram . |
| 5,610,084 | 3/1997 | Solo de Zaldivar . |

FOREIGN PATENT DOCUMENTS 44 30 366   3/1995   Germany .

OTHER PUBLICATIONS

Kuroi et al., "Novel NICE (Nitrogen Implantation into CMOS Gate Electrode and Source–Drain) Structure for High Reliability and High Performance 0.25 .mu.m Dual Gate CMOS," IEDM Tech DIG. 1993, pp. 325–328.

Wolf et al., "Silicon Processing for the VLSI Era, vol. 1: Process Technology," Lattice Press 1986, pp. 168–171, 182–185, 198–200, 209–215, and 261–265.

Patent Abstracts of Japan, vol. 16, No. 447 (E–1266), Sep. 17, 1992 & JP 04 157766 A, May 29, 1992.

International Search Report for PCT/US 97/02514 dated Jul. 4, 1997.

*Primary Examiner*—Ngân V. Ngô
*Attorney, Agent, or Firm*—Kevin L. Daffer; Conley, Rose & Tayon

[57] ABSTRACT

An integrated circuit fabrication method incorporating nitrogen into the polysilicon-dielectric interface in an MOS transistor. A semiconductor substrate having a P-well region and an N-well region is provided. Each well region includes channel regions and source/drain regions. A dielectric layer, preferably a thermal oxide, is formed on an upper surface of the semiconductor substrate. The thermal oxide can be grown in a nitrogen bearing ambient, an $O_2$ ambient, or an $H_2O$ ambient. Alternatively, the dielectric may be formed from a deposited oxide. Thereafter, a layer of polysilicon is formed on the dielectric layer and a plurality of "nitrogenated" polysilicon gates is formed on the dielectric layer over the channel regions. In a presently preferred embodiment, nitrogen species are introduced into the polysilicon gates with an ion implantation step. The nitrogen implantation step may alternatively be performed before or after the patterning of the polysilicon layer. If implantation occurs after patterning of the polysilicon layer, nitrogen will be introduced into the source/drain regions and effect an increase in drive current without a corresponding increase in leakage current. In a presently preferred embodiment, a dose of between $5 \times 10^{13}$ cm$^{-2}$ and $1 \times 10^{16}$ cm$^{-2}$ is used for implanting the nitrogen bearing species and the species is distributed within the plurality of polysilicon gates such that the concentration of the nitrogen is greatest at approximately a midpoint within said gates. The semiconductor substrate may be subsequently annealed in an ambient maintained between approximately 900° to 1100° C. preferably using a rapid thermal anneal apparatus.

7 Claims, 2 Drawing Sheets

NITROGENATED GATE STRUCTURE FOR IMPROVED TRANSISTOR PERFORMANCE AND METHOD FOR MAKING SAME

This is a Division of application Ser. No. 08/666,017, filed Jun. 19, 1996, now U.S. Pat. No. 5,872,049.

BACKGROUND OF THE INVENTION

1. Field of the Invention

This invention relates to semiconductor fabrication and more particularly to an improved method for forming a transistor by incorporating nitrogen into the transistor gate at the interface of the gate and the dielectric.

2. Description of the Relevant Art

The conventional fabrication of MOS (metal-oxide-semiconductor) transistors within a semiconductor substrate is well known. Typically, the substrate is divided into a plurality of active and isolation regions through an isolation process such as field oxidation or shallow trench isolation. After the isolation and active regions have been formed, the active regions may be further divided into N-well active regions and P-well active regions by implanting N-type dopants and P-type dopants into their respective wells. A thin oxide is then grown on an upper surface of the semiconductor substrate in the active regions. This thin oxide serves as the gate oxide for subsequently formed transistors. Next, a plurality of polysilicon gate structures are formed wherein each polysilicon gate traverses an active region effectively dividing the active region into two regions referred to as the source region and the drain region. After formation of the polysilicon gates, a pair of implants is performed to introduce P-type dopant species into the source/drain regions of the N-wells and N-type dopant species into the source/drain regions of the P-wells. The dopant species used in conventional transistor processing typically include phosphorus and arsenic for N-type impurities and boron for P-type impurities.

As transistor geometries shrink below 1 micron, the limitations of conventional transistor processing become more and more apparent. As the thickness of the gate oxide decreases below 100 angstroms, devices become more susceptible to diffusion of impurities contained within the gate structure across the gate oxide and into the active area of the transistor. This problem is especially acute for gate structures into which boron is implanted. In addition, it is believed that many loosely formed bonds exist at the interface between the gate oxide structure and the polysilicon gate structure in conventionally formed transistors. The presence of these loosely formed bonds is believed to contribute to undesirable transistor characteristics such as susceptibility to voltage breakdown. Still further, as devices become smaller and more densely packed upon a semiconductor substrate surface, it becomes increasingly important to minimize the leakage current of each individual transistor. It is believed that leakage current can be created by a scattering effect that occurs as electrons traverse the channel between a device's source region and drain region. As the number of transistor devices within a single integrated circuit increases, leakage current can become significant enough to raise the temperature of the semiconductor substrate, slowing the device and, eventually, raising the temperature above the operational limit of the device.

Therefore, it would be highly desirable to fabricate MOS transistors in a manner that reduced or eliminated diffusion from a gate structure to an underlying active region of the transistor, improved the bond structure of the polysilicon gate oxide interface thereby improving the characteristics of the interface, and increased the source/drain drive current without a corresponding increase in leakage current.

SUMMARY OF THE INVENTION

The problems outlined above are in large part addressed by a method of fabricating an integrated circuit in which nitrogen is incorporated into the transistor gate at the interface between the gate and the underlying dielectric. The nitrogen in the silicon gate fabricates the formation of stronger bonds with the underlying dielectric, preferably an oxide, and therefore results in improved transistor characteristics including higher resistance to gate oxide voltage breakdown. The presence of nitrogen within the gate structure also inhibits the diffusion of impurities, especially boron, from the gate structure into the active region of the underlying transistor. The reduction of dopant diffusion across the gate dielectric enables the formation of devices with thinner gate oxides and, therefore, superior operating characteristics. In one embodiment of the present invention, the nitrogen is also incorporated into source/drain regions of the transistor. In this embodiment, the presence of nitrogen within the source/drain regions results in an increase in drive current without a corresponding increase in leakage current. In an embodiment in which it is desired to grow a dielectric over source/drain regions after implanting impurities into the source/drain regions, the nitrogen species are introduced into the gate structure prior to gate etch. In this manner, introduction of the nitrogen will be blocked from entering the source/drain regions thereby allowing a subsequent oxidation of the source/drain region.

Broadly speaking, the present invention contemplates a method of fabricating an integrated circuit. The method comprises the providing of a semiconductor substrate that has a P-well region and an N-well region. The N-well region is laterally displaced from the P-well region. Both the N-well and the P-well regions include channel regions and source/drain regions. A dielectric layer is formed on an upper surface of the semiconductor substrate. Thereafter, a plurality of "nitrogenated" silicon gates is formed on the dielectric layer over the channel regions. In a presently preferred embodiment of the invention, the dielectric layer comprises a thermal oxide. In one embodiment, the thermal oxide is grown in a nitrogen bearing ambient. In this embodiment, the dielectric layer comprises an oxide which includes nitrogen species. In an alternative embodiment, the thermal oxide is grown in an $O_2$ or $H_2O$ ambient.

The present invention further contemplates a method of fabricating an integrated circuit comprising providing a semiconductor substrate. The substrate has an N-well and a P-well region laterally displaced from each other. The P-well and N-well regions have channel regions and source/drain regions contained therein. Next, a dielectric layer is formed on the upper surface of the semiconductor substrate. A polysilicon layer is then deposited on the dielectric layer. Portions of the polysilicon layer are then removed over the source/drain regions to form a plurality of polysilicon gates. A blanket implant is then performed with a nitrogen bearing species such that said species is incorporated into the plurality of polysilicon gates and into the source/drain regions. In the presently preferred embodiment, the nitrogen bearing species is distributed within the plurality of polysilicon gates such that the concentration of the nitrogen is greatest at approximately a midpoint within said gates. In another embodiment, the semiconductor substrate is annealed in an ambient maintained between approximately 900° to 1100° C. after the blanket implant has been performed.

The present invention still further contemplates a method of fabricating an integrated circuit. The integrated circuit is fabricated by providing a semiconductor substrate having a P-well region and an N-well region. The P-well and N-well regions are laterally displaced from each other. Both the P-well and the N-well regions further comprise channel regions and source/drain regions. Next, a dielectric layer is formed on the semiconductor substrate upper surface. The dielectric layer is preferably formed by growing a thermal oxide. Nitrogen may optionally be incorporated into the dielectric layer. Next, a layer of polysilicon is deposited on the dielectric layer. A blanket implant of the polysilicon layer is then performed with a nitrogen bearing species. Next, portions of the nitrogenated polysilicon layer are removed over the source/drain regions. In a presently preferred embodiment, the blanket implant of the polysilicon layer is performed such that a concentration of the nitrogen species is maximum at a midpoint of the polysilicon layer. In a presently preferred embodiment, a dose used for the blanket implant is between $5 \times 10^{13}$ cm$^{-2}$ and $1 \times 10^{16}$ cm$^{-2}$.

The present invention still further contemplates an integrated circuit. The integrated circuit comprises a semiconductor substrate having an upper region. The upper region includes a P-well and an N-well which are laterally displaced from each other. A dielectric layer is located on an upper surface of the semiconductor substrate. The integrated circuit further comprises a first gate structure which is formed on the dielectric layer over a channel region of the P-well. The integrated circuit further comprises a second gate structure formed on the dielectric layer over a channel region of the N-well. The integrated circuit further comprises a first source region and a first drain region which are laterally displaced on either side of the P-well channel region. The first source and drain regions are of N-conductivity type. A second source region and a second drain region laterally displaced on either side of the N-well channel region are included within the integrated circuit. The second source and drain regions are of P-conductivity type. The first and second gates include a finite concentration of a nitrogen bearing species. The nitrogen species is situated at an interface of the dielectric layer and the first and a second gate structures. In a presently preferred embodiment, the semiconductor substrate of the integrated circuit comprises silicon. In another embodiment, the dielectric layer is comprised of thermal $SiO_2$ and may optionally include a nitrogen bearing species.

BRIEF DESCRIPTION OF THE DRAWINGS

Other objects and advantages of the invention will become apparent upon reading the following detailed description and upon reference to the accompanying drawings in which.

Figure 1:
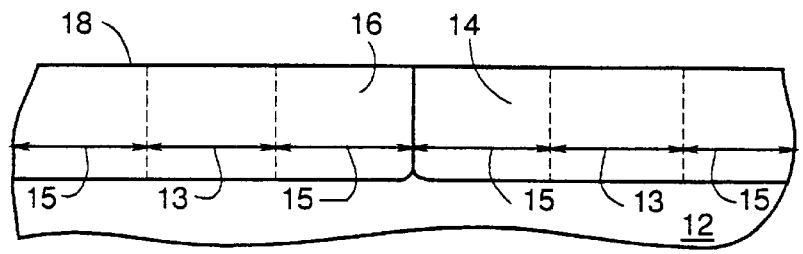
FIG. 1 is a partial cross-sectional view of a semiconductor substrate having a P-well and an N-well region contained therein.

While the invention is susceptible to various modifications and alternative forms, the specific embodiments hereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
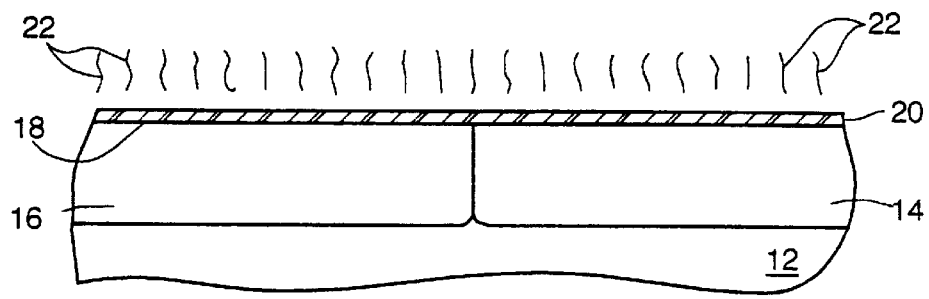
FIG. 2 is a processing step subsequent to FIG. 1 in which a dielectric layer has been formed on an upper surface of the semiconductor substrate with a thermal oxidation process.

Turning now to the drawings, FIG. 1 shows a semiconductor substrate 12. Semiconductor substrate 12 has an upper surface 18 and is comprised of P-well region 16 which is laterally displaced from N-well region 14. Formation of P-well 16 and N-well 14 is well known in the semiconductor field and can be accomplished by introducing dopants of the correct conductivity type into the respective wells. For the N-well 14, the dopant is preferably comprised of phosphorus or arsenic impurities while, for the P-well 16, the dopant is preferably comprised of boron. P-well 16 defines regions in which N-channel transistors will subsequently be formed while N-well 14 defines regions into which P-channel transistors will subsequently be formed. Turning now to FIG. 2, a dielectric layer 20 is formed on an upper surface 18 of semiconductor substrate 12. Preferably, dielectric layer 20 is formed with a thermal oxidation process step represented in the drawing as 22. The thermal oxidation can be accomplished in an ambient of $O_2$ or $H_2O$. Alternatively, nitrogen can be incorporated into dielectric layer 20 by performing the thermal oxidation of semiconductor substrate 12 in an ambient containing the nitrogen species. As will be described in more detail below, dielectric layer 20 will serve as a gate dielectric for transistors formed subsequently. In a presently preferred embodiment, dielectric layer 20 is 25–200 angstroms thick.

Figure 3:
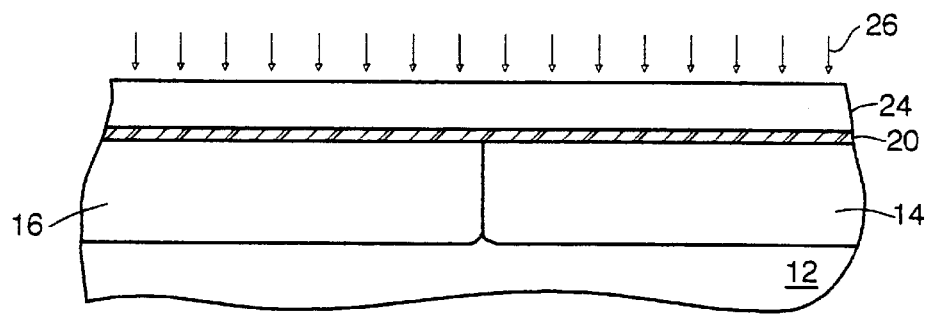
FIG. 3 is a processing step subsequent to FIG. 2 in which a polysilicon layer has been formed on the dielectric layer an a nitrogen bearing species is introduced into the polysilicon layer.
Figure 4:
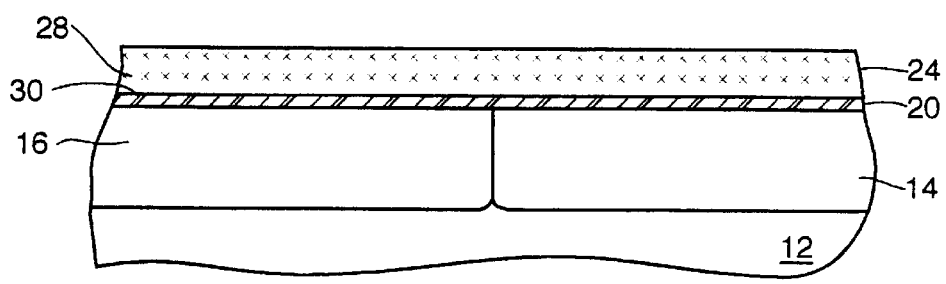
FIG. 4 is a partial cross-sectional view subsequent to FIG. 3 depicting the nitrogen incorporated into the polysilicon layer.

Turning now to FIG. 3, a processing step subsequent to FIG. 2 is shown in which a conductive layer 24 has been formed on the dielectric layer 20. In the presently preferred embodiment, conductive layer 24 comprises heavily doped polysilicon. In alternative embodiments not shown, conductive layer 24 may be comprised of a composite including polysilicon, aluminum, tungsten, titanium, or other suitable conducting material. FIG. 3 further shows nitrogen implant 26. In certain applications, it is desired to prevent the introduction of nitrogen into the upper surface of P-well 16 or N-well 14. The introduction of nitrogen into the silicon substrate 12 inhibits or prevents significant oxidation of the nitrogenated silicon in subsequent processing. Therefore, if it is desired to grow a significant thickness of oxide in the active regions after formation of source/drain regions, then a nitrogen implant should be performed prior to the patterning of conductive layer 24. Therefore, as shown in FIG. 3, nitrogen implant 26 is performed prior to patterning of polysilicon layer 24. FIG. 4 shows a partial cross-sectional view of semiconductor substrate 12 after implant 26 of FIG. 3. As seen in FIG. 4, nitrogen species 28 is incorporated throughout conductive layer 24. The energy and dose of implant 26 is optimized such that nitrogen species 30 occur at an interface between dielectric layer 20 and throughout conductive layer 24. Implant 26 is further optimized to minimize the occurrence of nitrogen in P-well 16 and N-well 14.

Figure 5:
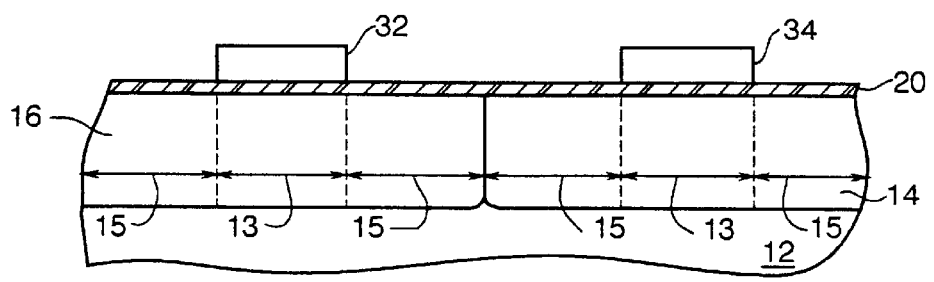
FIG. 5 is a processing step subsequent to FIG. 2 in which a polysilicon layer has been formed and patterned on the dielectric layer to form first and second gate structures.
Figure 6:
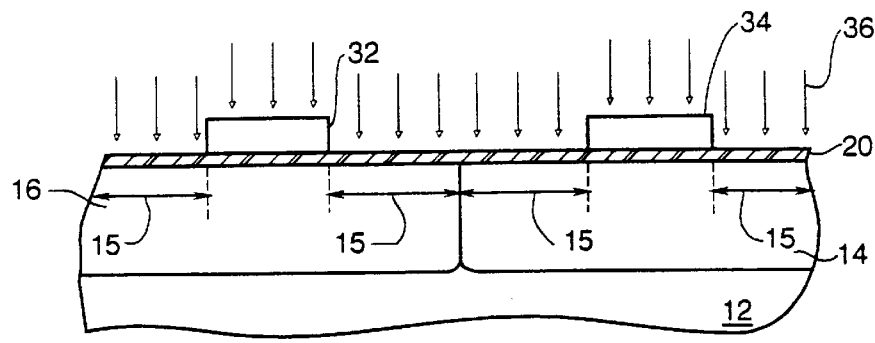
FIG. 6 is a processing step subsequent to FIG. 5 in which nitrogen is implanted into the polysilicon layer.
Figure 7:
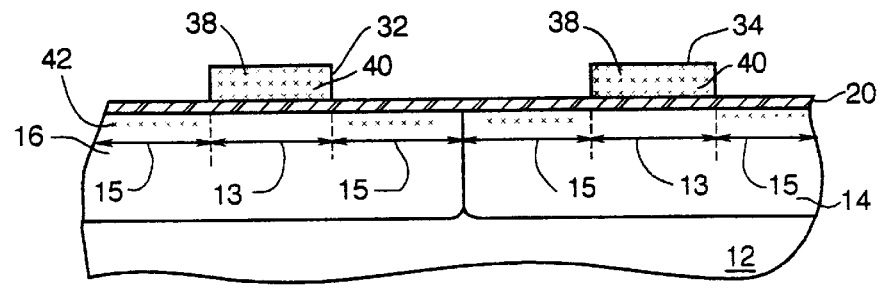
FIG. 7 is a processing step subsequent to FIG. 6 showing nitrogen incorporated into the source/drain regions and the fire and second gate structures.

Turning now to FIGS. 5–7, an alternative process sequence is shown in which conductive layer 24 is patterned prior to the nitrogen implant. In this embodiment, nitrogen species will be introduced into the source/drain regions of P-well 16 and N-well 14. Referring to FIG. 5, polysilicon layer 24 is patterned to form first gate structure 32 and second gate structure 34. First gate 32 and second gate 34 are patterned to coincide with channel regions 13 within P-well 16 and N-well 14, respectively. Source/drain regions 15, on the other hand, coincide with the absence of a gate structure. Patterning of conductive layer 24 is accomplished with conventional photolithography and etch processing technologies.

Turning now to FIG. 6, blanket implant 36 of nitrogen is performed across the upper topology of semiconductor substrate 12. Because conductive layer 24 has been patterned prior to blanket implant 36, nitrogen will penetrate the relatively thin dielectric 20 and create a nitrogen concentration in source/drain regions 15 within P-well 16 and N-well 14, respectively. In the presently preferred embodiment, the dose used for blanket implant 36 is between $5\times10^{13}$ cm$^{-2}$ and $1\times10^{16}$ cm$^{-2}$. FIG. 7 shows a partial cross-sectional view of semiconductor substrate 12 after completion of blanket implant 36. Nitrogen species is incorporated into first gate structure 32, second gate structure 34, and source/drain regions 15. It is believed that incorporating nitrogen into gate structures 32 and 34 and into source/drain regions 15 has multiple beneficial effects. Without being constrained to theory, it is believed that incorporating nitrogen into the gate structures substantially reduces the rate at which dopants diffuse from gate structures 32 and 34 through dielectric layer 20 and into active regions 13 of P-well 16 and N-well 14. In particular, second gate structure 34 is typically implanted with boron in a subsequent processing step. As is well known, boron diffuses at a rate approximately 10 times faster than the diffusion rate of other commonly used dopants. It is believed that nitrogen species 40 located at the interface between gate structure 34 and dielectric layer 20 serves as a barrier that prevents boron within second gate 34 from diffusing through dielectric layer 20. It is further believed that the presence of nitrogen 42 within active regions 15 of P-well 16 and N-well 14 serves to reduce scattering and thereby increases drive current without substantially increasing leakage current.

Figure 8:
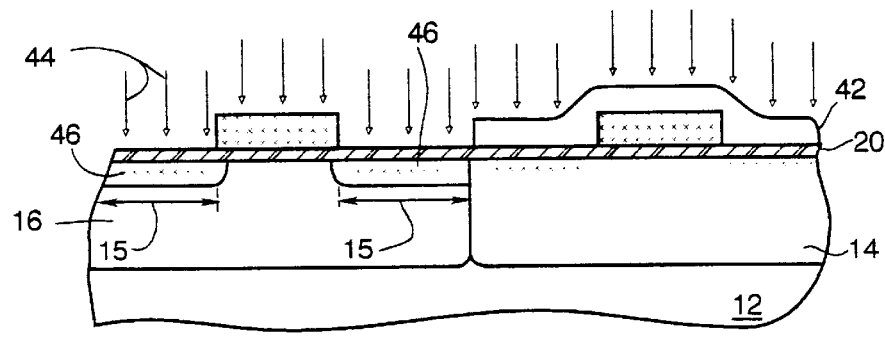
FIG. 8 is a processing step subsequent to FIG. 7 in which a layer of photoresist has been patterned to cover the N-well region and an implant has been performed to form source/drain regions in the P-well.

Turning now to FIG. 8, a processing step subsequent to FIG. 7 is shown in which photoresist layer 42 has been patterned to cover N-well 14. After patterning of photoresist layer 42, first source/drain implant 44 is performed to introduce N-type impurities into source/drain regions 15 of P-well 16. The implant of source/drain regions 15 in P-well 16 is preferably accomplished using phosphorus or arsenic.

Figure 9:
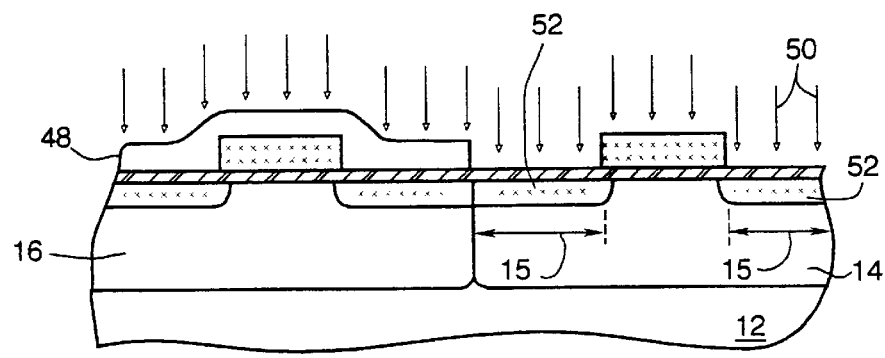
FIG. 9 is precessing step subsequent to FIG. 8 in which a photoresist layer has been patterned to cover the N-well region and an implant performed to form the source/drain regions of the P-well region.

FIG. 9 shows a subsequent processing step in which a photoresist layer 48 is patterned to cover P-well 16 leaving N-well 14 exposed. A second source/drain implant 50 is then performed to incorporate P-type dopants into source/drain regions 15 of N-well 14, resulting in the formation P-plus source/drain regions 52.

Figure 10:
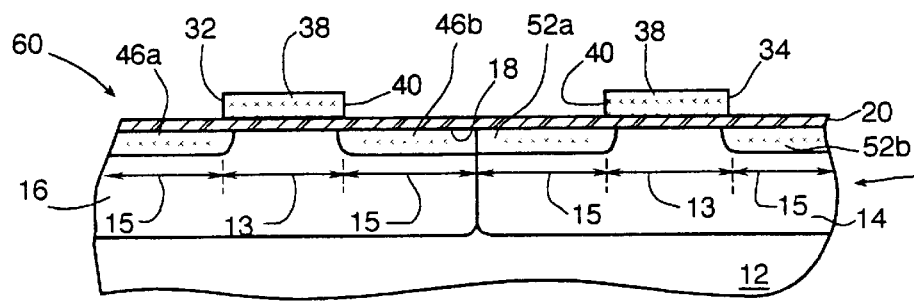
FIG. 10 is a partial cross-sectional view of an integrated circuit showing nitrogen incorporated into the source/drain and gate structures of first and second transistors located over N-wells and P-wells respectively.

Turning now to FIG. 10, integrated circuit 60 is shown comprising semiconductor substrate 12 having an upper region 11 comprised of P-well region 16 laterally displaced from an N-well region 14. Dielectric layer 20 is located on upper surface 18 of semiconductor substrate 12. First gate structure 32 is formed on dielectric layer 20 over channel region 13 of P-well 16. Second gate structure 34 is formed on dielectric layer 20 over channel region 13 of N-well 14. First source/drain region 46a and second source/drain region 46b are formed within an upper surface of P-well 16 laterally displaced on either side of the P-well channel region 13. First source/drain region 46a and second source/drain region 46b are of N-conductivity type. Second source/drain region 52a and 52b are laterally displaced on either side of N-well channel region 13 in N-well 14. Second source/drain regions 52a and 52b are of P-conductivity type. First gate 32 and second gate 34 include a finite concentration of a nitrogen bearing species at an interface of the dielectric layer 20 and the first dielectric 32 and the second dielectric 34, respectively.

As will be obvious to one skilled in the art having the benefit of this disclosure, the process sequence described in FIGS. 1–10 is capable of producing a transistor structure. It will be further appreciated that the transistor structure of the present invention is useful in preventing the diffusion of impurities from the gate structures into the active regions through the same gate dielectric. It will be still further appreciated that incorporating nitrogen into the source/drain regions, the active current is increased without substantially increasing the leakage current. It will be still further appreciated that because the nitrogenated gate regions tend to form stronger bond with the underlying gate dielectric, that the quality of the polysilicon SiO$_2$ interface is improved.

It is to be understood that the form of the invention shown and described in the detailed description and the drawings is to be taken merely as presently preferred examples of how nitrogen can be incorporated into the source/drain regions and the gate structure of a MOS type transistor. Obvious various of the method disclosed would be apparent to those skilled in the art having the benefit of this disclosure. For example, semiconductor substrate could be of N-type or P-type silicon. As another example, the source/drain regions 46 and 52 could be formed using a 2 implant process and an LDD oxide structure as is well known in the semiconductor field. It is intended that the following claims be interpreted broadly to embrace all the variations of the preferred embodiments disclosed.

What is claimed is:

1. An integrated circuit comprising:
   a semiconductor substrate having an upper region, wherein said upper region includes a p-well and an n-well laterally displaced from said p-well;
   a dielectric layer located on an upper surface of said semiconductor substrate;
   a first gate structure formed on said dielectric layer over a p-well channel region of said p-well;
   a second gate structure formed on said dielectric layer over an n-well channel region of said n-well; and
   wherein said first and second gates include a peak concentration of a nitrogen bearing species at approximately a midpoint within each said first and second gate structures.

2. The integrated circuit of claim 1 wherein said semiconductor substrate comprising silicon.

3. The integrated circuit of claim 1 wherein said dielectric layer comprises thermal $SiO_2$.

4. The integrated circuit of claim 1 wherein said dielectric layer includes a nitrogen bearing species.

5. The integrated circuit of claim 1 wherein said first and second gate structures comprise polysilicon.

6. The integrated circuit of claim 1 further comprising:

a first source region and a first drain region laterally displaced on either side of said p-well channel region, wherein said first source and drain regions are of n-conductivity type; and a second source region and a second drain region laterally displaced on either side of said n-well channel region, wherein said second source and drain regions are of p-conductivity type.

7. The integrated circuit of claim 6 wherein said first and second source and drain regions include a finite concentration of a nitrogen bearing species.

* * * * *